US009281469B2

(12) United States Patent
Quan et al.

(10) Patent No.: US 9,281,469 B2
(45) Date of Patent: Mar. 8, 2016

(54) MAGNETIC SEED FOR IMPROVING BLOCKING TEMPERATURE AND SHIELD TO SHIELD SPACING IN A TMR SENSOR

(71) Applicant: Headway Technologies, Inc., Milpitas, CA (US)

(72) Inventors: Junjie Quan, Milpitas, CA (US); Kunliang Zhang, Fremont, CA (US); Min Li, Fremont, CA (US); Hui-Chuan Wang, Pleasanton, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 14/580,329

(22) Filed: Dec. 23, 2014

(65) Prior Publication Data

US 2015/0108593 A1 Apr. 23, 2015

Related U.S. Application Data

(62) Division of application No. 13/750,401, filed on Jan. 25, 2013, now Pat. No. 8,921,126.

(51) Int. Cl.
| | |
|---|---|
| *H01L 43/10* | (2006.01) |
| *H01L 43/12* | (2006.01) |
| *G01R 33/09* | (2006.01) |
| *H01L 43/08* | (2006.01) |
| *H01L 43/02* | (2006.01) |

(52) U.S. Cl.
CPC .............. *H01L 43/10* (2013.01); *G01R 33/098* (2013.01); *H01L 43/02* (2013.01); *H01L 43/08* (2013.01); *H01L 43/12* (2013.01)

(58) Field of Classification Search
CPC .... G11B 5/3906; G11B 5/3909; B82B 10/00; H01F 10/3272; G01R 33/093; H04L 3/02; H01L 43/02; H01L 4/081
USPC .......... 257/295, 421; 438/3; 360/319, 324.11, 360/324.2
See application file for complete search history.

(56) References Cited

U.S. PATENT DOCUMENTS

| | | | |
|---|---|---|---|
| 8,164,862 B2 | 4/2012 | Zhang et al. | |
| 8,230,583 B2 | 7/2012 | Lille | |
| 2005/0052789 A1 | 3/2005 | Zhang et al. | |
| 2006/0087771 A1* | 4/2006 | Gill | 360/324.11 |
| 2008/0117553 A1* | 5/2008 | Carey et al. | 360/324.2 |
| 2008/0151438 A1* | 6/2008 | Tanaka et al. | 360/319 |
| 2008/0158739 A1* | 7/2008 | Ide et al. | 360/324.2 |
| 2009/0174968 A1 | 7/2009 | Singleton et al. | |
| 2009/0251829 A1 | 10/2009 | Zhang et al. | |

* cited by examiner

*Primary Examiner* — Dung Le
(74) *Attorney, Agent, or Firm* — Saile Ackerman LLC; Stephen B. Ackerman; Rosemary L. S. Pike

(57) ABSTRACT

The blocking temperature of the AFM layer in a TMR sensor has been raised by inserting a magnetic seed layer between the AFM layer and the bottom shield. This gives the device improved thermal stability, including improved SNR and BER.

5 Claims, 2 Drawing Sheets

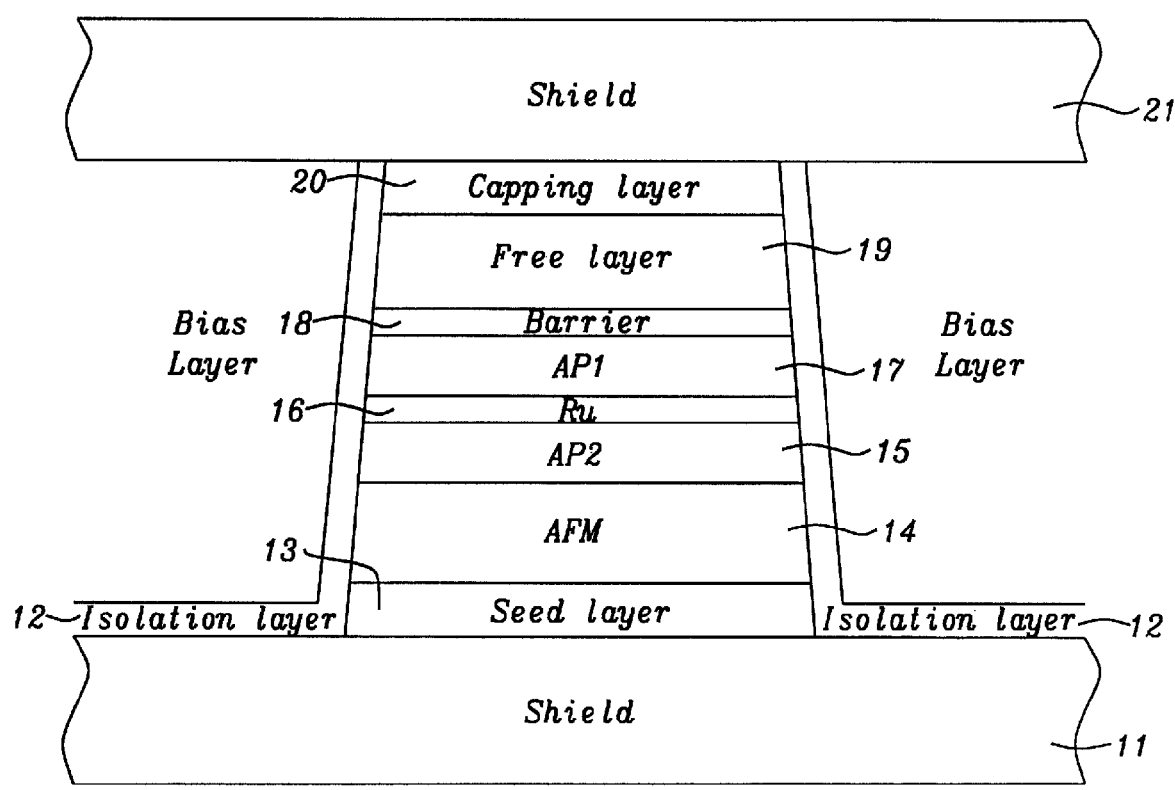
FIG. 1 - Prior Art

MAGNETIC SEED FOR IMPROVING BLOCKING TEMPERATURE AND SHIELD TO SHIELD SPACING IN A TMR SENSOR

This is a divisional application of U.S. Ser. No. 13/750,401 filed on Jan. 25, 2013.

TECHNICAL FIELD

This application relates to the general field of magnetic sensors with particular reference to tunneling magneto-resistive (TMR) sensors and how to reduce high temperature noise.

BACKGROUND

A conventional TMR sensor includes a seed layer, an anti-ferromagnetic (AFM) layer having a blocking temperature $T_b$, synthetic anti-parallel (SyAP) layers, one of which serves as the reference layer, a barrier layer, a free layer, and one or more capping layers. As TMR sensors become smaller, sensor noise improvement, especially at high temperatures, is critical for maintaining or improving the signal to noise ratio (SNR) and the bit error ratio (BER) (the number of bit errors divided by the total number of transferred bits).

A Ta based seed layer, such as Ta/Ru, Ta/Cr, Ta/Cu or Ta/NiCr, is usually used as the seed layer for a TMR sensor but it is very difficult to improve the thermal stability of such seeds without increasing AFM and/or seed thickness. This leads to an increase in shield-to-shield spacing, resulting in a resolution penalty.

FIG. 1 shows a TMR sensor of the prior art. Depicted there are bottom and top shields, 11 and 21 respectively, conventional seed layer 13 (ranging in thickness from 5 Å to 30 Å), AFM layer 14 (ranging in thickness from 50 Å to 100 Å), antiparallel (AP)2 layer 15, AP coupling layer 16 (usually of ruthenium), and AP1 (ranging from 10 Å to 40 Å), the latter also serving as the reference layer. AP1 is followed by insulated tunnel barrier layer 18 on which lies free layer 19 followed by capping layer(s) 20.

SUMMARY

It has been an object of at least one embodiment of the present disclosure to raise the blocking temperature of a TMR sensor's AFM layer, thereby improving its thermal stability.

Another object of at least one embodiment of the present disclosure has been to reduce shield to shield spacing thereby achieving better spatial resolution.

Still another object of at least one embodiment of the present disclosure has been to provide a process for manufacturing the disclosed TMR sensor.

A still further object of at least one embodiment of the present disclosure has been for the above process to be fully compatible with currently used processes.

These objects have been achieved by inserting a magnetic seed layer, between the AFM layer and the bottom shield layer. The first seed layer can be magnetic or non-magnetic. This raises the blocking temperature of the AFM layer, improving high temperature noise, including improved SNR and BER

BRIEF DESCRIPTION OF THE DRAWINGS

FIG. 1. Schematic drawing of conventional TMR sensor

DETAILED DESCRIPTION

Better thermal stability with much higher blocking temperature has been achieved by inserting a NiFeX based layer between the bottom shield and the AFM layer. Examples of NiFeX materials include, but are not limited to, NiFe, NiFeCr, NiFeW, NiFeRh, NiFeTa, NiFeMo, NiFeHf, NiFeNb, NiFeZr, NiFeTi and NiFeCo. This improvement in the thermal properties is achieved without degrading the sensor properties.

We disclose below how the blocking temperature of a TMR device is improved by replacing the conventional (non-magnetic) seed layer with a NiFeX based magnetic seed. The NiFeX based magnetic seed provides a better substrate on which to grow the AFM layer by enhancing the AFM crystal orientation.

The magnetic seed can also serve as a shield for the TMR sensor so, by removing the non-magnetic seed layer, the shield-to-shield spacing can be decreased.

Figure 2A:
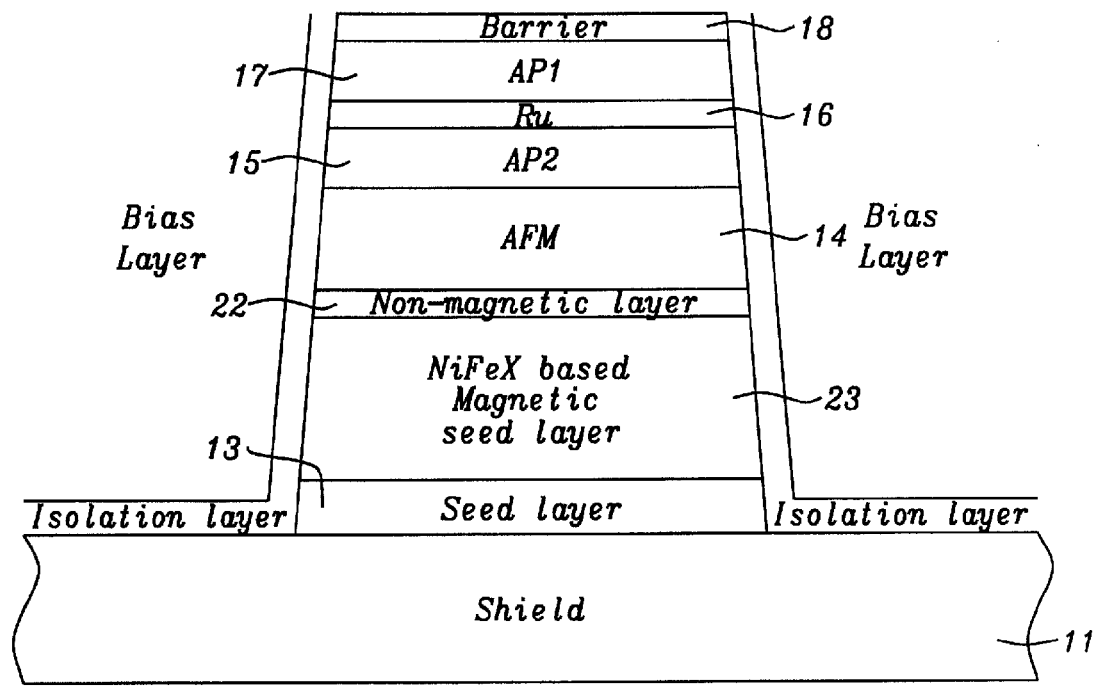
FIG. 2a. Schematic drawing of a first embodiment of the disclosed TMR sensor with a magnetic seed layer inserted to be part of the stack FIG. 2b. Schematic drawing of a second embodiment of the disclosed TMR sensor with a magnetic seed layer inserted as part of the shield structure
Figure 2B:
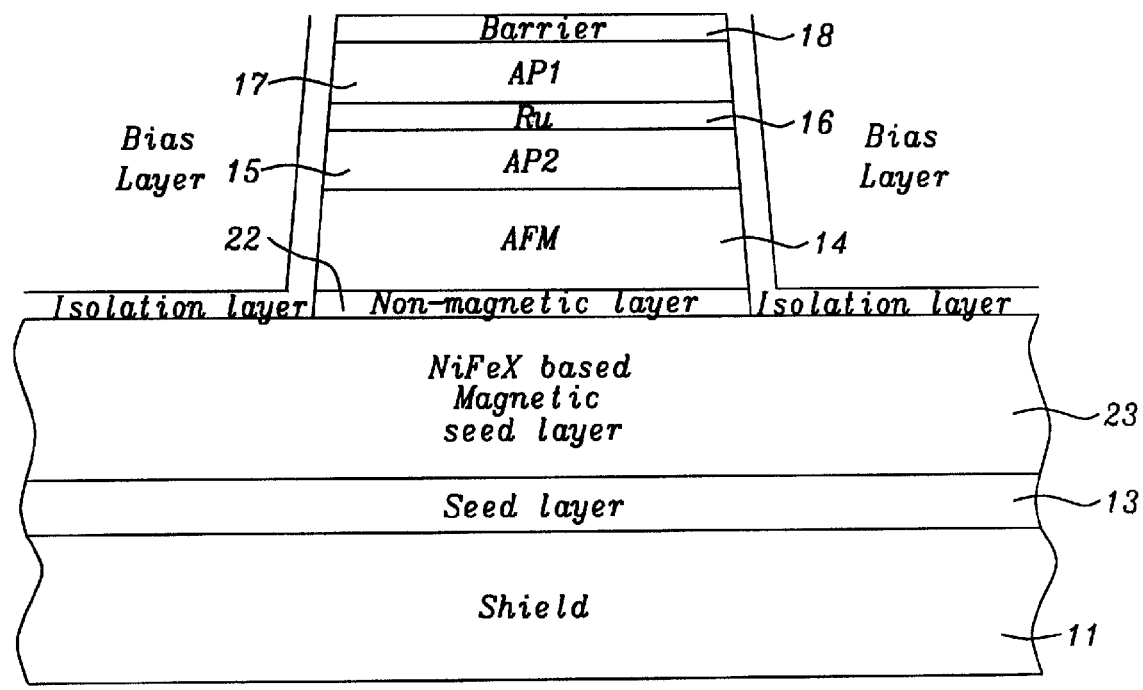

FIGS. 2a and 2b disclose two configurations that we have used to improve the Tb of a TMR sensor when NiFeX based magnetic seed layers replace conventional non-magnetic seed layers.

First seed layer 13 (which can be magnetic or non-magnetic) of an amorphous or fine-grained material is deposited first (on lower shield 11) to reduce/eliminate crystallographic influence of an underlying NiFe shield layer. The first seed layer ranges in thickness from 5 to 30 Å and includes, but is not limited to, Ta, CoFeB, CoFeZr, CoNiFeZr, CoFeHf, CoNiFeHf, CoFeTa, CoFeNiTa, CoFeNbZr and FeTa.

NiFeX type magnetic seed layers 23 are then deposited to provide the template for AFM growth (to a thickness in the of 20 to 200 Å range). Non-magnetic layer 22, such as Ru, Cr, Cu, Al, NiFeCr or NiCr, is then deposited on magnetic seed layer 23 (to a thickness in a range of 5 to 20 Å) followed by the deposition (on non-magnetic layer 22) of AFM layer 14. Note that non-magnetic layer 22 serves to eliminate exchange coupling between the AFM layer and the magnetic seed layer Also shown, though not part of the invention, are isolation layers 12 and the locations of the longitudinal bias layers.

Together with the device's magnetic first seed layer, magnetic seed layer 23 will be magnetically coupled to bottom shield 11, thereby acting as a shield itself, which reduces shield to shield spacing of the TMR sensor. For a thin non-magnetic first seed layer less than 10 Å thick, magnetostatic coupling between magnetic seed and bottom shield will reduce the effective shield to shield spacing of a TMR sensor.

The NiFeX based seed layer can be a single layer or a multi-layer, provided at least one of its NiFeX layers contains at least 40 atomic percent of Fe. Different compositions of NiFeX layers (including combination with CoFeX) can be used in the multilayer configurations in order to optimize the magnetic properties (including magnetostriction) of the magnetic seed layer. CoFeX examples include, but are not limited to, CoFe, CoFeB, CoFeNb and CoFeNi. Also, the smoothness of the magnetic seed surface is usually improved with a multilayer configuration, which provides a better template to grow the TMR sensors.

FIGS. 2(a) and 2(b) show examples of two different milling depths—(a) leaving only the bottom shield unmilled and (b) terminating milling just before the NiFeX magnetic seed layer is reached. The milling depth that is selected is a matter of designer choice, usually dictated by the needs of the bias layers. For example, with the magnetic seed layer the blocking temperature of the sensor can be improved to be as high as 40 degrees, which provides advantages for thermal stability.

X-ray diffraction analysis showed that the NiFeX magnetic seed enhanced AFM crystallographic orientation, which is important for improved thermal stability.

What is claimed is:

1. A TMR sensor that has high thermal stability, comprising:

a first seed layer on a lower magnetic shield;

a single or multilayered magnetic seed layer on said first seed layer comprising at least a NiFeX layer containing at least 40 atomic percent of Fe wherein said multilayered magnetic seed layer also comprises materials selected from the group consisting of CoFe, CoFeB, CoFeNb and CoFeNi;

a non-magnetic layer on said magnetic seed layer;

an antiferromagnetic (AFM) layer on, and in contact with, said non-magnetic layer; and starting at said AFM layer and extending upwards, in succession, away therefrom, a synthetic antiferromagnetic trilayer, a tunnel barrier layer, a free layer, a capping layer, and a top magnetic shield.

2. The TMR sensor described in claim 1 wherein NiFeX layer is selected from the group consisting of NiFe, NiFeCr, NiFeW, NiFeRh, NiFeTa, NiFeMo, NiFeHf, NiFeNb, NiFeZr, NiFeTi, and NiFeCo.

3. The TMR sensor described in claim 1 wherein part of said TMR sensor is a conical stack that extends from below said top magnetic shield as far as said magnetic seed layer.

4. The TMR sensor described in claim 1 wherein part of said TMR sensor is a conical stack that extends from below said top magnetic shield as far as said lower magnetic shield whereby said magnetic seed layer is coupled to said lower magnetic shield, thereby reducing shield to shield spacing for said TMR sensor.

5. The TMR sensor described in claim 1 wherein said multilayered magnetic seed layer has a total thickness in a range of from 20 to 200 Å.

* * * * *